US012743029B2

(12) United States Patent
Kidron et al.

(10) Patent No.: US 12,743,029 B2
(45) Date of Patent: Sep. 22, 2026

(54) DIGITAL PHOTOLITHOGRAPHY SYSTEM, COMPONENTS THEREOF AND RELATED METHODS

(71) Applicant: Applied Materials, Inc., Santa Clara, CA (US)

(72) Inventors: Assaf Kidron, Cupertino, CA (US); Rudolf Brunner, Menlo Park, CA (US); Davidi Kalir, Hod Hashron (IL); Timothy Thomas, Portland, OR (US); Anilkumar Borkar, Bangalore (IN); Jiawei Shi, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 122 days.

(21) Appl. No.: 18/719,681

(22) PCT Filed: Dec. 9, 2022

(86) PCT No.: PCT/US2022/052452
§ 371 (c)(1),
(2) Date: Jun. 13, 2024

(87) PCT Pub. No.: WO2023/114108
PCT Pub. Date: Jun. 22, 2023

(65) Prior Publication Data

US 2025/0053101 A1 Feb. 13, 2025

Related U.S. Application Data

(60) Provisional application No. 63/290,422, filed on Dec. 16, 2021.

(51) Int. Cl.
*G03F 7/20* (2006.01)
*G03F 7/00* (2006.01)

(52) U.S. Cl.
CPC ...... *G03F 7/70833* (2013.01); *G03F 7/70975* (2013.01)

(58) Field of Classification Search
CPC ............. G03F 7/70833; G03F 7/70975; G03F 7/70258; G03F 7/70291; G03F 7/70275
See application file for complete search history.

(56) References Cited

U.S. PATENT DOCUMENTS 5,583,688 A 12/1996 Hornbeck
6,238,852 B1 5/2001 Klosner
(Continued)

FOREIGN PATENT DOCUMENTS

CN 210803969 U 6/2020
JP 2004062091 A 2/2004
(Continued)

OTHER PUBLICATIONS

International Search Report and Written Opinion for International Application No. PCT/US2022/052452, mailed Apr. 17, 2023, 10 pages.

*Primary Examiner* — Mesfin T Asfaw
(74) *Attorney, Agent, or Firm* — Lowenstein Sandler LLP

(57) ABSTRACT

Embodiments of the disclosure relate to digital lithography systems and components thereof. Digital lithography systems may include a rotation assembly for an exposure unit, including a kinematic socket configured to support the exposure unit, the kinematic socket having a socket seat and a sphere received in the socket seat, wherein the socket seat is configured to support a load of the exposure unit during translational movement and the sphere is a pivot point for tip and tilt movement; and a motor configured to rotate the one or more exposure unit via the kinematic socket. The rotation assembly may provide a point of contact for the exposure unit together with two additional points of contact that
(Continued)

stabilize movement of the exposure unit. Also disclosed are methods of preparation and use of such systems and components.

19 Claims, 12 Drawing Sheets

(56) References Cited

U.S. PATENT DOCUMENTS

| | | | | |
|---|---|---|---|---|
| 8,773,638 | B2 | 7/2014 | Dodoc | |
| 8,896,827 | B2 | 11/2014 | Chimmalgi | |
| 9,063,436 | B2 | 6/2015 | Owa | |
| 9,250,509 | B2 | 2/2016 | Markle | |
| 10,599,055 | B1 | 3/2020 | Coskun | |
| 2003/0047660 | A1 * | 3/2003 | Gaunt | G02B 7/1825 248/483 |
| 2007/0296936 | A1 * | 12/2007 | Kato | G03F 7/70308 355/53 |
| 2008/0218883 | A1 | 9/2008 | Torii et al. | |
| 2015/0015701 | A1 | 1/2015 | Yu | |
| 2015/0064298 | A1 | 3/2015 | Syao | |
| 2017/0094251 | A1 | 3/2017 | Wolke | |
| 2019/0369499 | A1 | 12/2019 | Lai | |

FOREIGN PATENT DOCUMENTS

| | | | |
|---|---|---|---|
| JP | 2007505345 | A | 3/2007 |
| JP | 2020052246 | A | 4/2020 |
| JP | 2021113925 | A | 8/2021 |
| WO | 2021221633 | A1 | 11/2021 |

* cited by examiner

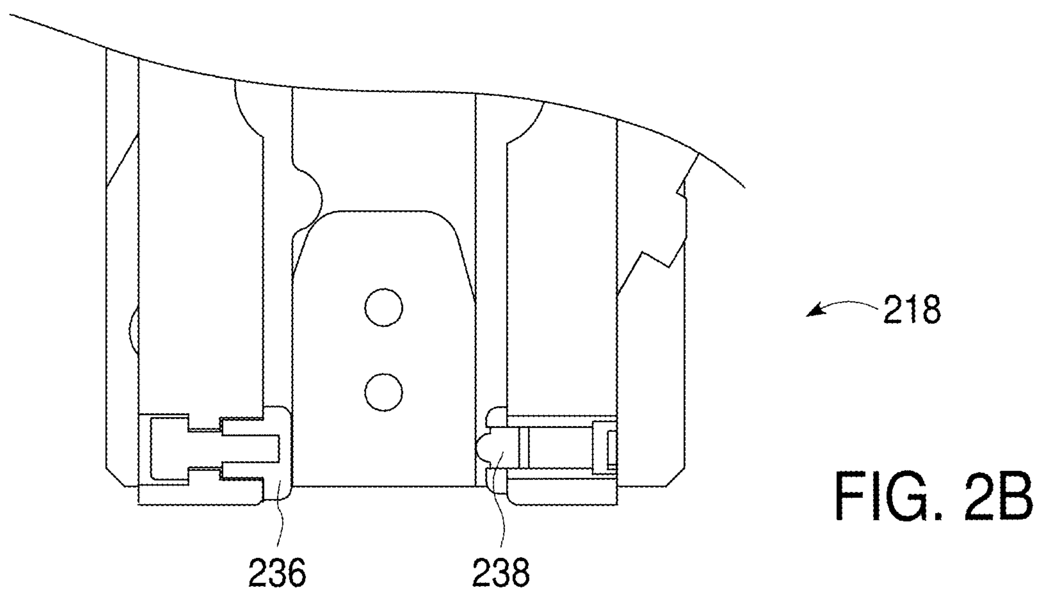
FIG. 2B
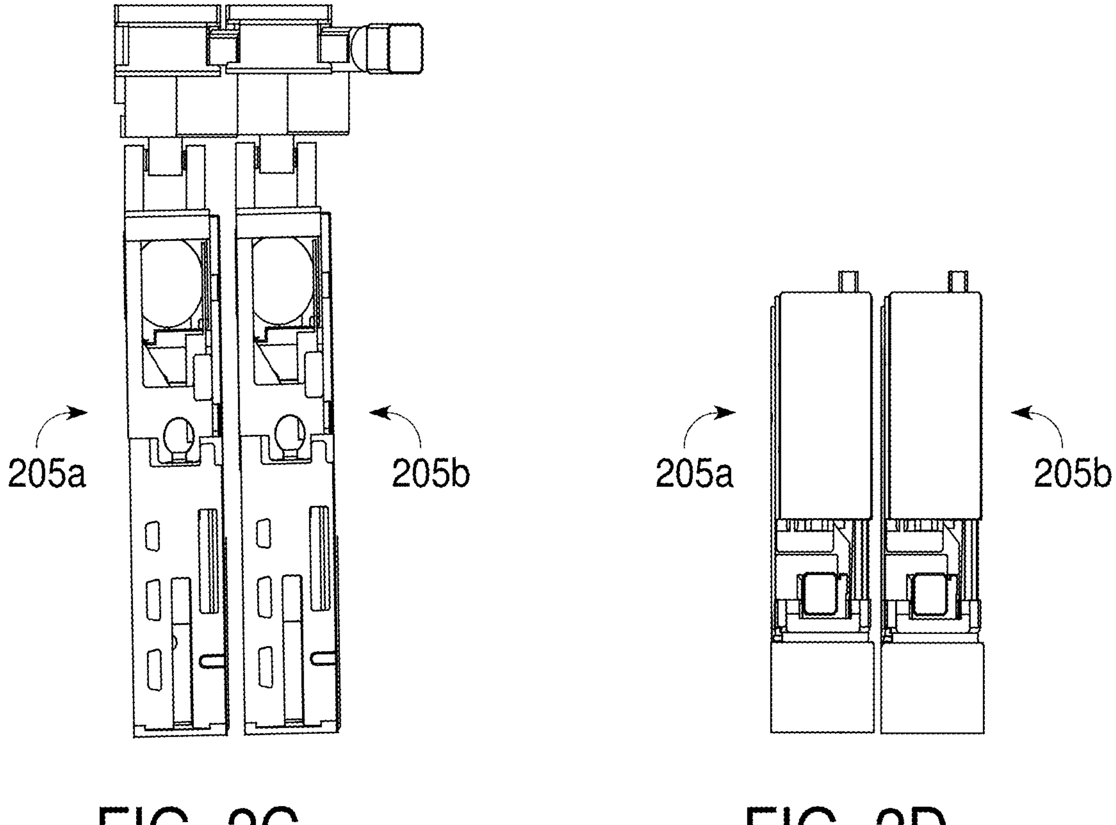
FIG. 2C
FIG. 2D 218
334
330
332
338
340
336
309

332
340
338
332
309
330
336

Figure 7:
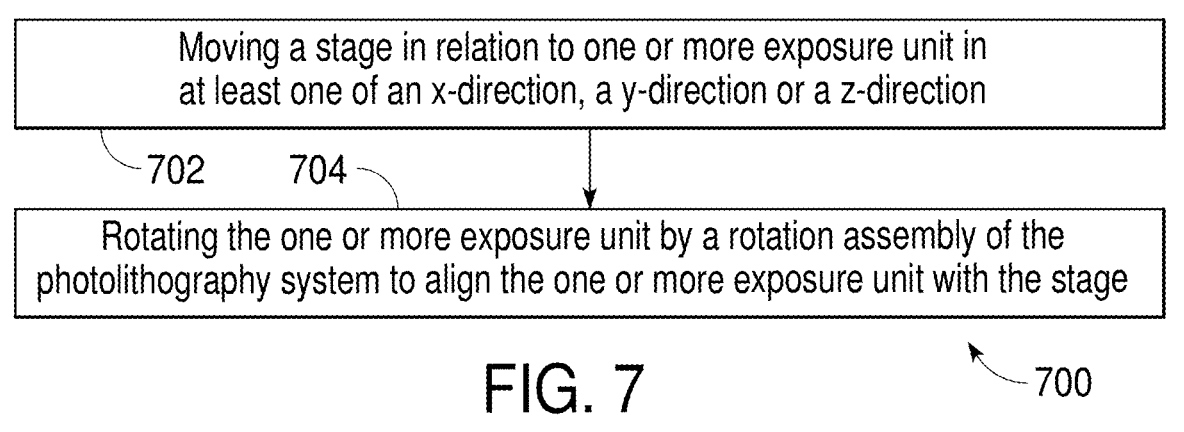

Moving a stage in relation to one or more exposure unit in at least one of an x-direction, a y-direction or a z-direction

702

704

Rotating the one or more exposure unit by a rotation assembly of the photolithography system to align the one or more exposure unit with the stage

DIGITAL PHOTOLITHOGRAPHY SYSTEM, COMPONENTS THEREOF AND RELATED METHODS

CLAIM OF PRIORITY

This application is a National Stage of International Application No. PCT/US22/52452, filed Dec. 9, 2024, which claims the benefit of U.S. Provisional Patent Application No. 63/290,422 filed Dec. 16, 2021, which is incorporated by reference herein.

TECHNICAL FIELD

The instant disclosure relates generally to electronic device fabrication. More particularly, the instant disclosure relates to digital photolithography systems and one or more components (e.g., a mounting assembly for tip, tilt, Z and rotation adjustment of one or more exposure units) of such systems. Also disclosed are methods of manufacturing and methods of using such components and systems.

BACKGROUND

Photolithography is used in the manufacture of semiconductor and display devices, such as flat panel display devices. Examples of flat panel display devices include thin-film display devices, such as, e.g., liquid crystal display (LCD) devices and organic light emitting diode (OLED) display devices. Large-area substrates can be used to manufacture flat panel display devices for use with computers, touch panel devices, personal digital assistants (PDAs), cell phones, television monitors, etc.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to various embodiments, disclosed is a rotation assembly for an exposure unit, comprising: a kinematic socket configured to support the exposure unit, the kinematic socket comprising a socket seat and a sphere received in the socket seat, wherein the socket seat is configured to support a load of the exposure unit during translational movement and the sphere is a pivot point for tip and tilt movement; and a motor configured to rotate the one or more exposure unit via the kinematic socket.

In yet further embodiments, disclosed are photolithography systems, comprising one or more exposure unit configured to rotate by a rotation assembly; a platform spaced apart from the one or more exposure unit, wherein the platform is configured to move in an x-direction, a y-direction and a z-direction with respect to the one or more exposure unit; the rotation assembly comprising: a kinematic socket configured to support the one or more exposure unit, the kinematic socket comprising a socket seat and a sphere received in the socket seat, wherein the socket seat is configured to support a load of the one or more exposure unit during translational movement and the sphere is a pivot point for tip and tilt movement; and a motor configured to rotate the exposure unit via the kinematic socket, wherein the rotation assembly is mounted to the photolithography system by at least three contact points.

Further disclosed herein is a method of positioning one or more exposure unit in a photolithography system, comprising: moving a stage in relation to the one or more exposure units in at least one of an x-direction, a y-direction or a z-direction; and rotating the one or more exposure unit by a rotation assembly of the photolithography system to align the one or more exposure unit with the stage.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2B shows a side view of a digital lithography system in accordance with one or more embodiments of the disclosure.

FIG. 2C shows a side view of an embodiment of a digital lithography system in accordance with one or more embodiments of the disclosure.

FIG. 2D shows a front-side view of exposure units of a digital lithography system in accordance with one or more embodiments of the disclosure.

FIG. 7 shows a block diagram for of a method for positioning an exposure unit in a photolithography system in accordance with one or more embodiments of the disclosure.

DETAILED DESCRIPTION

Figure 1:
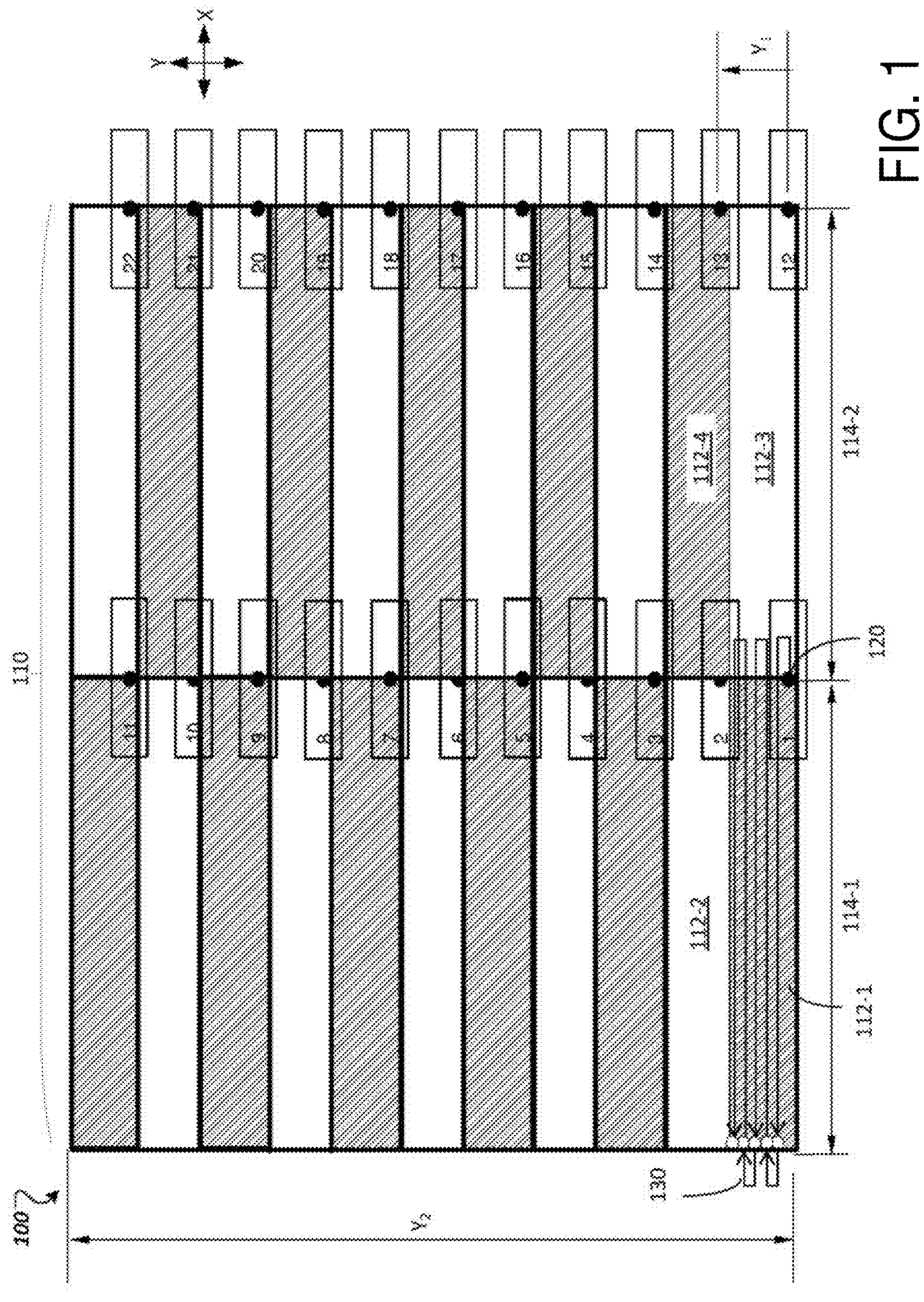
FIG. 1 shows a schematic of a digital photolithography system in accordance with one or more embodiments of the disclosure.

Digital lithography can be used to generate a digitally aligned etch mask on a substrate surface without the need for a mask (e.g., maskless lithography). Digital lithography technology (e.g., such as Texas Instruments'® programmable light steering technology) enables high speed and high-resolution maskless lithography solutions for printed circuit board (PCB) patterning, solder masks, flat panel displays, laser marking, and other digital exposure systems that benefit from high speed and precision. Digital lithography is used to directly expose patterns onto photoresist films without the use of contact masks (e.g., photomasks). This can reduce material cost, improves production rates, and allow for rapid changes of the pattern. Direct exposure increases productivity compared to narrow laser beam or masked systems. An advantage of digital lithography is the ability to change lithography patterns from one run to the next, without incurring the cost of generating a new photomask. Illustratively, digital lithography can be used to perform large-area patterning during electronic device fabrication.

Multiple digital lithography exposure units ("exposure units") can be used to improve throughput of a digital lithography tool. Conventional exposure units can print or expose a rectangular non-overlapping region, or clipping layer. The clipping layer may serve as a filter to inform layout-processing software to keep patterns to be printed by a particular exposure unit on the clipping layer associated with that exposure unit. Each of the multiple exposure units can be responsible for a portion of the printing area and for a different clipping layer.

A digital lithography system can include one or more (e.g., an array of) precision optical modules or exposure units mounted to an optical support structure, or bridge structure. Conventionally, angle setting operations (i.e., clocking of a projection image around a z-axis) for the optical modules are performed manually and may provide limited resolution. Such manual operations introduce serviceability challenges in repeatably setting the tip, tilt and focus of projection images about a z-axis.

Embodiments of the present disclosure address these and other shortcomings of existing technologies by providing a motorized rotation assembly for an optical device of a digital photolithography system that adjusts the image plane of a projection system on a moving substrate. The motorized rotation assembly may also control the angle of the projected image with respect to the z-axis. According to one or more embodiments herein, the motorized rotation assembly enables the setting of an individual angle of a projected image in a multi-projection system. Having the capability to control this angle enables the use of common system parameters within the digital lithography system. The addition of a motorized rotation assembly provides a rotational (or fourth) degree of freedom that enables the tuning of the rotation parameter, which impacts the multiplicity (M), green dot pattern (GDP) and Image stability (IS) stage speed in a safe manner. The angle variation may be less than about 5 μrad, less than about 3 μrad, about 0.5 μrad to about 5 μrad, or any individual value or sub-range within these ranges.

One or more exposure unit (also referred to as an EYE or exposure unit) within the photolithography system, can digitally pattern light onto a display substrate that moves beneath it. The motorized rotation assembly as described herein may be coupled to and mounted together with the exposure units (exposure units) within the photolithography apparatus. The bridge structures discussed above provide a secondary structure arranged on top of the moving display to help maintain its stability. Conventionally, the exposure units (exposure units) are mounted with a set of mechanical stages having a three-dimensional (3D) motion axis. The x-y motors for tip and tilt operations are mounted together above the z motor, which provides focusing operations. According to one or more embodiments herein, the motorized apparatus is mounted within the lithography system and provides rotation of the disclosure units about the z-axis.

In at least one embodiment, the motorized rotation assembly as described herein provides high resolution rotation control of a tightly packed projection system without influencing the image tip, tilt and focus operations. The motorized rotation assembly enables setting the clocking of the projection image to a three (3) micro-radian resolution during the setup of the digital lithography system without having to enter the processing apparatus. The mechanism as described herein also provides automated control of the image clocking and does not rely on manual clocking as in conventional systems. The image clocking operation of motorized rotation assemblies as described herein do not interfere with the image tip, tilt and focus operations of the lithography system. The mechanical design of the motorized rotation assembly according to one or more embodiments, also improves vibrations (dynamic) stability of the image plane. The motorized rotation assembly provides optical focus across the entire projected image onto the substrate below.

In addition to better focus, the design of the motorized rotation assembly provides improved image stability. When the assembly includes an EYE having a high aspect ratio, where the center of gravity of the EYE is off-center toward a top end of the EYE, a kinematic support structure does not over constrain the EYE's tip and tilt functions while also being adjustable in four degrees of freedom resulting in enhanced stability of the one or more exposure unit. The term "high aspect ratio" as used herein may be understood as inserting the optical module within an imaginary rectangular box: the length of the box may be in the Z direction, the width may be in the X direction, and the height may be in Y direction; a high aspect ratio of length/width may be greater than about 2.0 and of width/height may be greater than about 1.5.

Systems and components as described herein provide a fourth degree of freedom for the movement of one or more exposure units. In particular, the described systems and components can add rotation, to tip, tilt and vertical movement of the one or more exposure units. This rotation degree of freedom enables the unification of image angles projected from neighboring optical modules. The four degrees of freedom mechanism also provides stiffness of the optical module in both the X and Y directions, thus, improving the image stability of the optical module as compared to known lithography systems and components in the art.

FIG. 1 is a top-down view of a digital lithography system ("system") 100, in accordance with some embodiments. As shown, the apparatus 100 includes a stage assembly 110 including a base (e.g., a granite base), a stage and a substrate disposed on the stage. The substrate may be a glass plate, a wafer, a PCB, or other type of substrate. The substrate may correspond to or be positioned in a digital lithography printing or scanning area having a number of scan regions, including scan regions 112-1 through 112-4. The left portion of the stage assembly 110 corresponds to a first bridge 114-1 above the stage assembly 110 and the right portion of the stage assembly 110 corresponds to a second bridge 114-2 above the stage assembly 110. As will be described in further detail below, exposure units are attached to the bridges 114-1 and 114-2. In some embodiments, the length of each bridge 114-1 and 114-2 can range between about 500 (millimeters) mm and about 1000 mm. For example, the length of each bridge 114-1 and 114-2 can be about 750 mm.

The substrate can include a photoresist material disposed on a material to be etched. The photoresist material can be a positive photoresist material (i.e., where a portion of the photoresist material that is exposed to light becomes soluble to a photoresist developer) or a negative photoresist material (i.e., where a portion of the photoresist material that is exposed to light becomes insoluble to a photoresist developer). Thus, by removing designated portions of the photoresist material, a photoresist pattern can be formed. In some embodiments, the material to be etched is a conductive material (e.g., metal). For example, the conductive material can be molybdenum. After the designated regions of the photoresist material are removed, the now-exposed material can be etched in accordance with the photoresist pattern. For example, wiring can be formed during the etch process. Alternatively, the patterned material can itself be photosensitive, eliminating the need to add a photoresist layer and performing the following etch process.

To perform the photoresist patterning, the apparatus 100 further includes a first column of digital lithography exposure units ("exposure units") hanging from the first bridge 114-1 and a second column of exposure units hanging from the second bridge 114-2. For example, the first column of exposure units includes exposure units 1 through 11 and the second column of exposure units includes exposure units 12 through 22. Thus, in this illustrative example, there are 22 total exposure units shown. However, the number of exposure units shown in FIG. 1 should not be considered limiting, and the system 100 can include any suitable number of exposure units accordance with the embodiments described herein.

Each exposure unit can include a lens assembly that can project an image onto the photoresist material of the substrate. Each lens assembly is shown adjacent to a bottom-right corner of its associated scan region. For example, a lens assembly 120 of exposure unit 1 is associated with the scan region 112-1. In some embodiments, each lens assembly is about 4 mm tall and about 3 mm wide. However, each lens assembly can have any suitable dimensions in accordance with the embodiments described herein.

During a digital lithography process, each exposure unit is moved relative to the substrate to expose a region (e.g., a rectangular region) of the substrate to electromagnetic radiation such as light (e.g., ultraviolet light, near-ultraviolet light, etc.). This may include moving the exposure units and/or moving the substrate. During scanning, the exposure units expose respective scan regions, in accordance with a programmed scan path. Instead of having the exposure units move above the stage assembly 110, the stage assembly 110 can move in the X-Y direction underneath the exposure units in accordance with the programmed scan path. Since the field-of-view of a lens assembly (e.g., lens assembly 120) can be smaller than its associated scan region (e.g., scan region 112-1), the stage assembly 110 may have to move back and forth repeatedly until the entire scan region (e.g., scan region 112-1) is printed. The lens assembly 120 is projected to scan the scan region 112-1, except for the first and last scans where trimming may occur based on the definition of the scan region 112-1. The greater the number of exposure units, the fewer scans that may be performed, which can correspond to higher throughput.

Each exposure unit can be responsible for a different scan region, which may or may not overlap with the adjacent scan regions of other exposure units. To avoid abrupt transitions from a first scan region to a second scan region adjacent to the first scan region (either attached to the same bridge or to a different bridge), the exposure unit corresponding to the first scan region can encroach into the second scan region. Similarly, the exposure unit corresponding to the second scan region can encroach into the first scan region. For example, exposure unit 1 can encroach into scan region 112-2 and/or scan region 112-3, and exposure unit 2 can encroach into scan region 112-1 and/or scan region 112-4.

In an example, a path 130 of the exposure unit 120-1 is illustratively depicted. The path 130 proceeds in a snake-like fashion. More specifically, during scanning, the stage assembly 110 moves in the X direction (i.e., from right to left) across the scan region 120-1, during which time the exposure unit 120-1 patterns a line across the scan region 120-1. The stage assembly 110, upon reaching the left edge of the scan region 112-1, moves in the Y-direction (i.e., up), and then moves in the X-direction (i.e., from left to right) to pattern another line across the scan region 120-1. The path 130 proceeds in this snake-like fashion until reaching the opposite end of the scan region 120-1, at which point a full image has been patterned on the substrate. The image can then be developed for substrate etching. The distance of stage travel in the Y-direction during scanning, "$Y_1$", can be any suitable distance in accordance with the embodiments described herein. In some embodiments, $Y_1$ can range between about 150 mm and about 180 mm. For example, $Y_1$ can be about 164 mm. The scan distance in the X direction for each exposure unit corresponds to the length of the bridges 114-1 and 114-2 in embodiments. The total width of the scan regions, "$Y_2$", can be any suitable width in accordance with the embodiments described herein. In some embodiments, "$Y_2$" can range between about 1600 mm and about 2000 mm. For example, $Y_2$ can be about 1800 mm. The travel distance for each scan (e.g., in the X-direction) can be different due to differences in substrate size. For example, in some embodiments, the substrate includes an 8-inch round wafer. As another example, in some embodiments, the substrate includes a 12-inch round wafer.

The scanning process shown in FIG. 1 can be used to create a display (e.g., a flat panel display) in embodiments. In some embodiments, the display is a liquid-crystal display (LCD).

According to one or more embodiments, disclosed herein is a digital lithography system that includes one or more exposure units (i.e., EYEs), a movable platform that sits beneath the exposure units that moves in the x-y-z direction (relative to the one or more exposure unit), and a movable support (i.e., a rotation assembly) to which one or more of the exposure units are attached that adjusts the angle of the exposure units relative to the platform (where rotation is about a z axis). The system is configured to rotate the EYE so that an angle of a mirror array of the EYE matches an angle of the platform. In at least one embodiment, each EYE has its own rotation device, and the rotations of the EYEs are matched so that instead of having a different patterning set of parameters for each of the EYEs, the EYEs all share the same set of parameters.

Figure 2A:
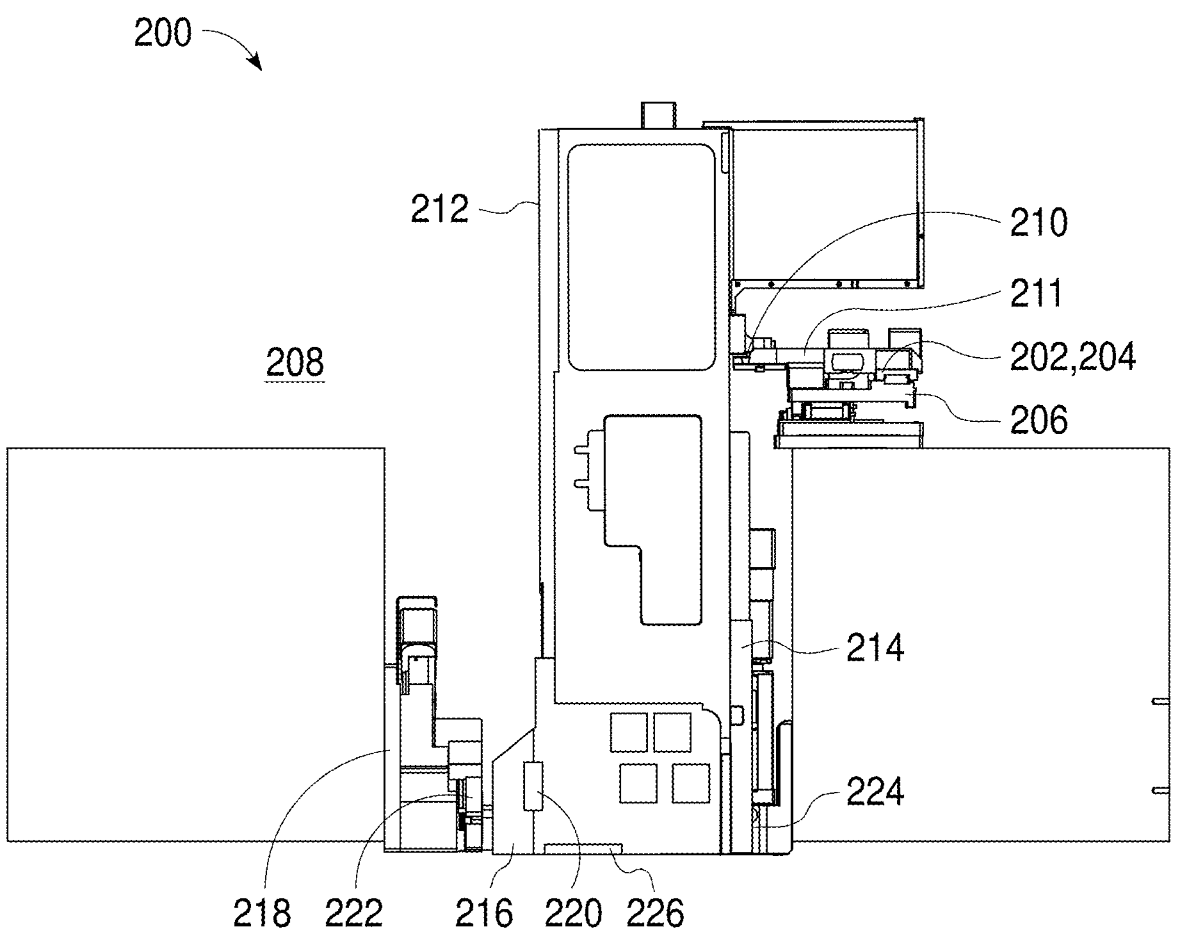
FIG. 2A shows a side view of a digital lithography system in accordance with one or more embodiments of the disclosure.
Figure 5A:
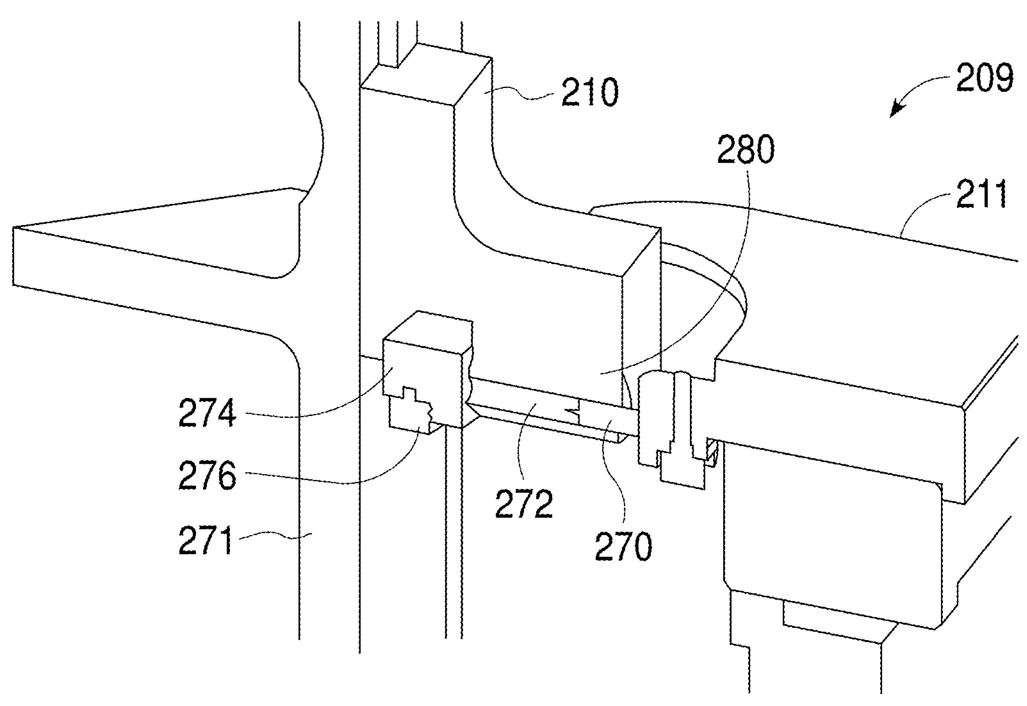
FIG. 5A shows an embodiment of a contact mechanism for an EYE of a digital lithography system in accordance with one or more embodiments of the disclosure.
Figure 5B:
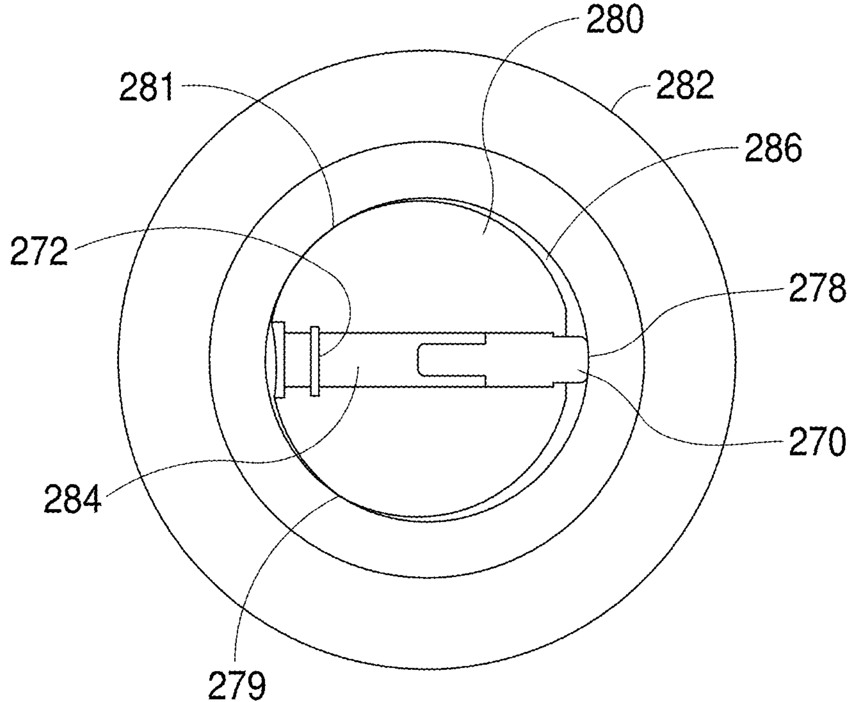
FIG. 5B shows an embodiment a contact mechanism for an EYE of a digital lithography system in accordance with one or more embodiments of the disclosure.

FIG. 2A shows a side view of a digital lithography system ("system") 200, in accordance with one or more embodiments. The system 200 includes at least three (3) points of contact to stabilize one or more exposure unit of the system. As shown, the system 200 includes an x-motor 202 and a y-motor 204 attached to a bridge structure 206. An optical module 208 in communication with the x-motor 202 and y-motor 204 includes one or more exposure unit (or EYE or exposure unit), EYE cable strain relief assemblies, an EYE stiffener base plate, an EYE controller box, a plurality of bridges and a plurality of EYE bracket beam or tubes spanning across each bridge. According to embodiments, the x-motor 202 and y-motor 204 each may be a piezo-electric motor, a stepper motor, a rotary air motor or other motor that controls planar movement of a stage, on which one or more substrate rests. The one or more exposure unit may be a digital micro-mirror device (DMD) configured to focus patterned light onto a substrate (e.g., pixel-by-pixel). A rotation assembly 218, as will be described in more detail below, may be configured to rotate the one or more exposure unit between two positions to match the angle between the exposure unit and the stage moving in the x-direction and/or y-direction (relative to the one or more exposure units) below. The EYE cable strain relief assembly effectively dampens EYE cable vibrations coming to the bridges to reduce or eliminate vibrations transmitted through the EYE via the cables. The EYE stiffener base plate provides support for the cable channel used for EYE stiffener pneumatic lines and sensors. The line contacts 210 are positioned between a contact mechanism 209 comprised of a sphere and two cylinders to facilitate connection between the x- and y-motors 202, 204 and the optical module 108. An embodiment of contact mechanism 209 is shown in FIGS. 5A and 5B. The x-motor 202 and y-motor 204 may be supported by structure 228. An x-y stage top plate is positioned relative to lower stacks (not shown) of the x-y stage.

The system 200 further includes a z-motor 214 in communication with the optical module 208. The z-motor 214 controls up and down movement of the stage in the z-direction relative to the one or more exposure unit 205*a*, 205*b*. The x-motor 202, y-motor 204 and z-motor 214 together control the three-dimensional position of the stage (and one or more substrate thereon) within a reactor space. The z-motor 214 is configured to adjust the position of the stage in the z-direction to focus the light emitted from the one or more exposure unit 205*a*, 205*b* onto at least one substrate. Precise positioning and alignment of the at least one substrate beneath the patterned light can reduce processing defects in devices formed on the substrates.

Structural covers 212 protect and contain internal components during operation and movement of the system 200. A lower lens cage 216 similarly provides a support structure surrounding the one or more exposure unit 205*a*, 205*b*. Coupled to the lower lens cage 216 is an internal lens Y contact 220. According to embodiments, the lower lens cage 216 and structural covers 212 can be adjusted when the z-stage is assembled in order to provide an EYE alignment station interface.

System 200 further includes a rotation assembly 218 (i.e., a motorized rotation assembly) comprised of tip, tilt and Z (TTZ) function components, rotation components and EYE parts including covers and the lens cage. The rotation assembly 218 is configured to rotate the one or more exposure unit 205*a*, 205*b* (see FIG. 2D). If a plurality of exposure units 205*a*, 205*b* is present, the rotation assembly 218 is configured to rotate the exposure units 205*a*, 205*b* independently or together. A minimum clearance between adjacent exposure units that reach a rotation hard stop may be about 1 mm to about 10 mm, about 4 mm to about 8 mm, or any individual value or sub-range within these ranges. In some embodiments, the photolithography system 200 includes about 10 to about 40 exposure units arranged in two rows. As shown in FIGS. 2A-2D, the rotation assembly 218 further includes an EYE rotation (DMD angle) point contact 222 that connects the rotation assembly 218 to the lower lens cage 216. According to various embodiments, the one or more exposure unit 205*a*, 205*b* may be configured to rotate at a nominal angle of about 70.0° to about 120.0°, about 80.0° to about 110.0°, about 90.0° to about 100.0°, about 91.1° to about 99.9°, or any individual value or sub-range within these ranges.

The rotation assembly 218 may be mounted within system 200 via a kinematic socket 224. The kinematic socket 224 supports three contact points and has the benefit of not over-constraining the EYE during tip and tilt movements. One contact point is at the joint between the rotation motor and the optical module; the other two contact points are two "hinges"—a bottom hinge may be the socket and the top hinge may be two Hertian contacts separated in the Y direction and a spring plunger contact. The rotation assembly 218 as described herein may be mounted as a projection system in the digital lithography system 200 using kinematic mounting at, for example, three (3) support locations: 1) a main load point (z socket 224) provides kinematic support (three point contacts) and a z-stage sets image focus; 2) an upper pivot provides kinematic support (two line contacts 210) and x-y stages introduce image tip and tilt; and 3) a projection system rotation (one point contact 220) and tilted projection system linear stage introduces image clocking. An embodiment of the kinematic socket is shown in FIGS. 4A-4D.

Figure 3A:
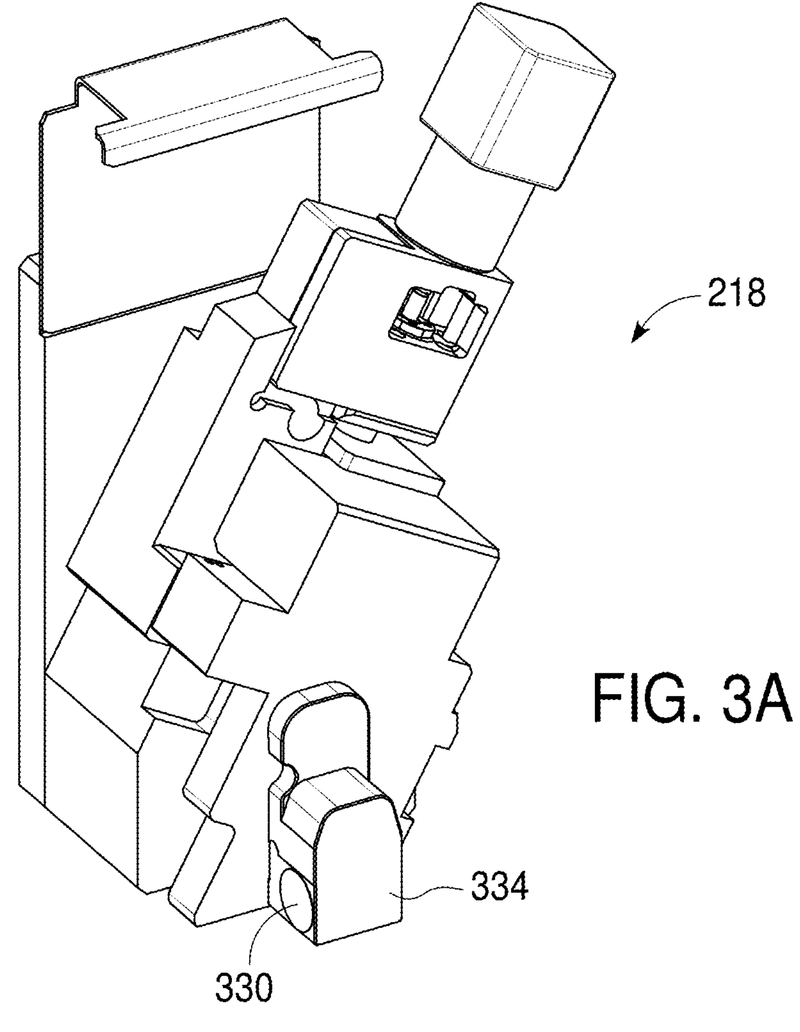
FIG. 3A shows a front-side perspective view of a motorized rotation assembly of a digital lithography system in accordance with one or more embodiments of the disclosure.
Figure 3B:
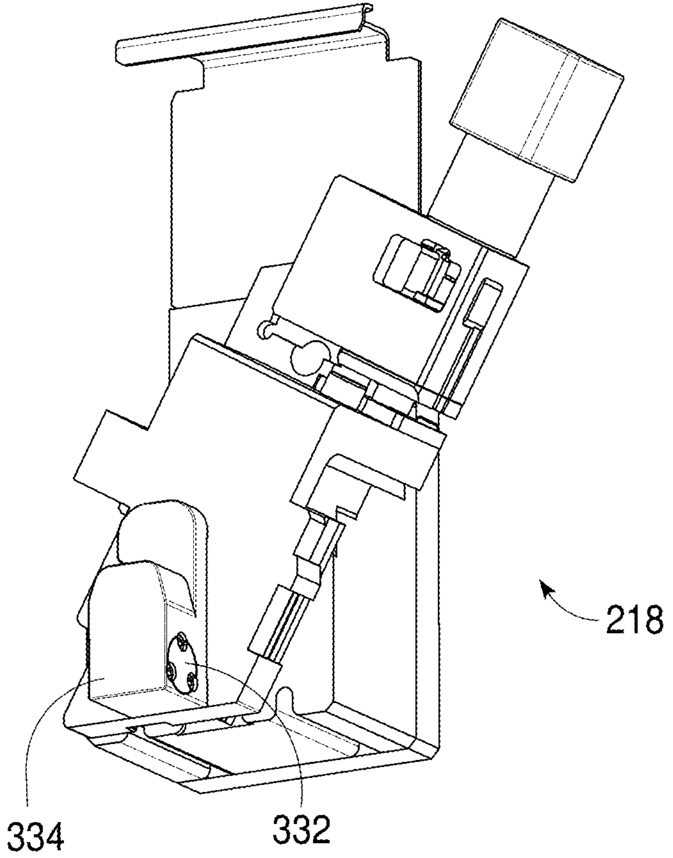
FIG. 3B shows a back-side perspective view of a motorized rotation assembly of a digital lithography system in accordance with one or more embodiments of the disclosure.
Figures 3C, 3D:
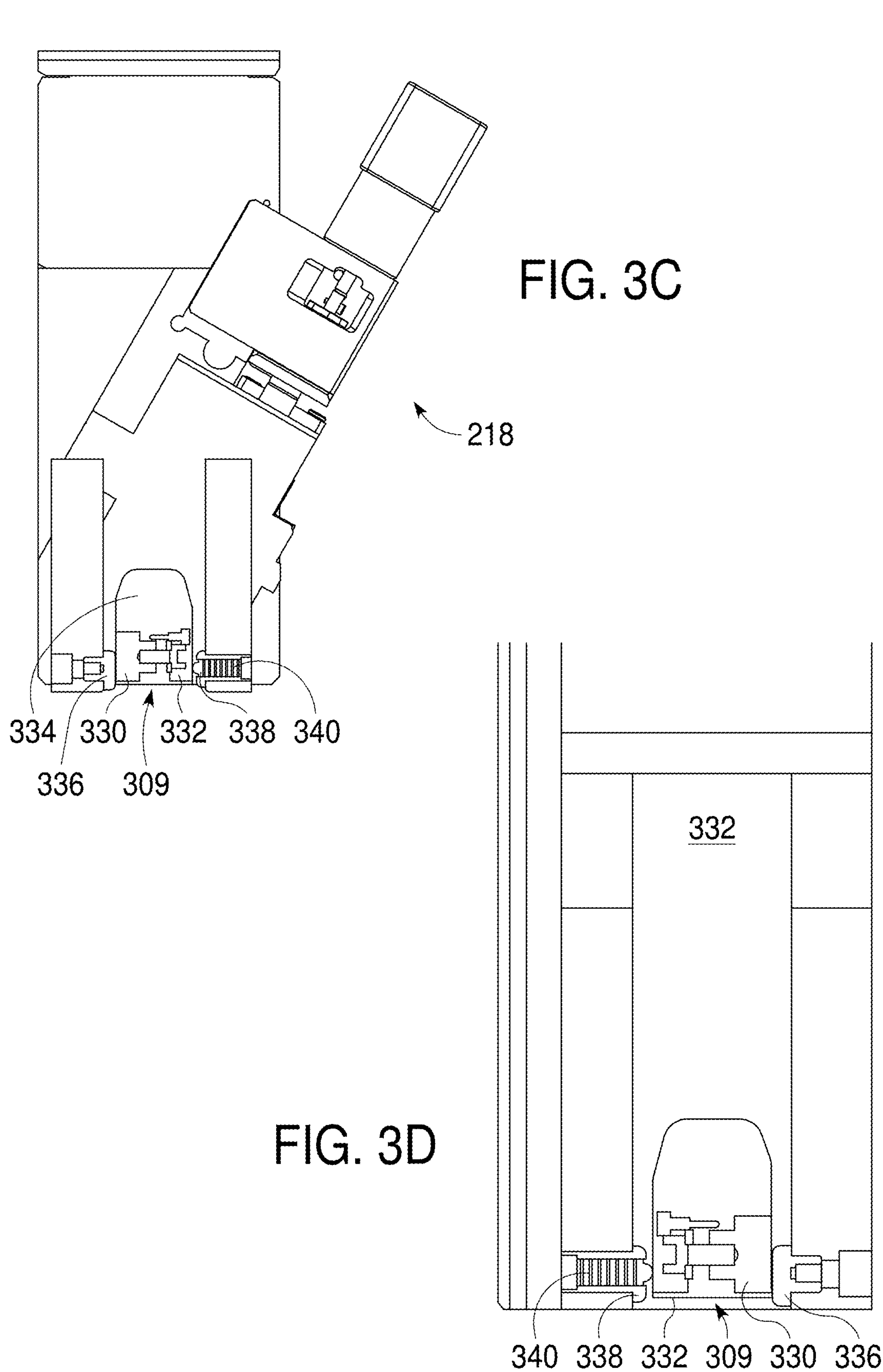
FIG. 3C shows a side view of a motorized rotation assembly of a digital lithography system in accordance with one or more embodiments of the disclosure.
FIG. 3D shows a side view of a contact mechanism of a motorized rotation assembly of a digital lithography system in accordance with one or more embodiments of the disclosure.
Figure 3E:
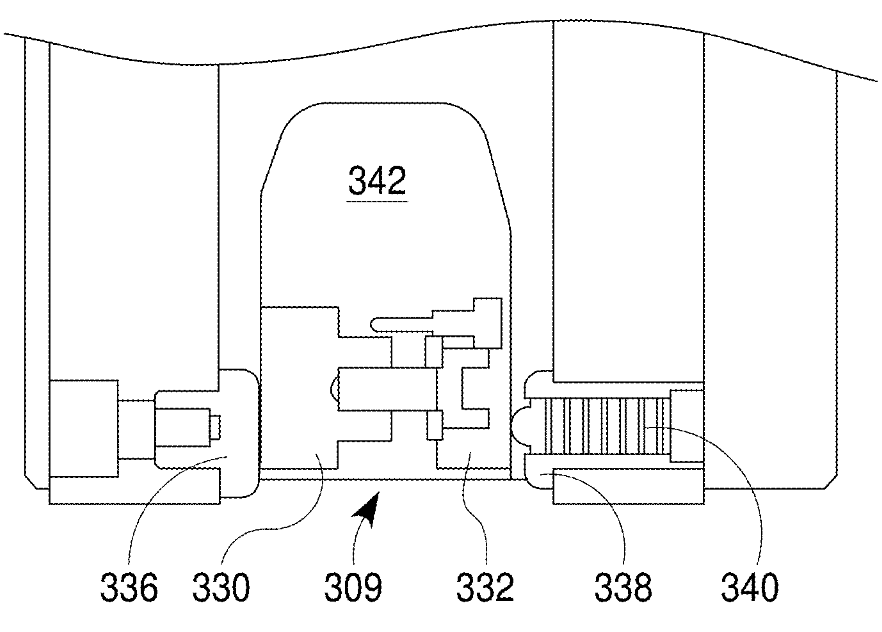
FIG. 3E shows a side view of a contact mechanism of a motorized rotation assembly of a digital lithography system in accordance with one or more embodiments of the disclosure.

FIGS. 3A-3G show an embodiment of a rotation assembly 218. The rotation assembly 218 may include a contact mechanism 309 configured to stabilize an exposure unit of the digital lithography system. Contact mechanism 309 may be a spring-and-pad assembly that includes a rotation pad 330 positioned opposite a pre-load contact pad 332 mounted within a housing structure 334. As shown in FIGS. 3C-3E, EYE rotation pad 330 is configured to contact EYE rotation pad 336. EYE rotation pad 330 may be formed of a tungsten carbide and EYE rotation pad 336 may be comprised of hardened stainless steel having chrome plating. In one or more embodiments, EYE rotation pad 336 may have a radius on the contact side of about 50 mm to about 150 mm, about 75 mm to about 125 mm, about 90 mm to about 100 mm or any individual value or sub-range within these ranges. As further shown in FIGS. 3C-3E, EYE pre-load contact pad 332 is configured to contact a bias spring pad 338 coupled to a bias spring 340. The bias spring 340 may be configured to provide a force against the EYE pre-load contact pad of about 1 N to about 20 N, about 5 N to about 15 N, about 8 N to about 10 N, or any individual value or sub-range with these ranges. Linear movement within rotation assembly 218 may be along line 342 as shown in FIG. 3E.

Figure 3F:
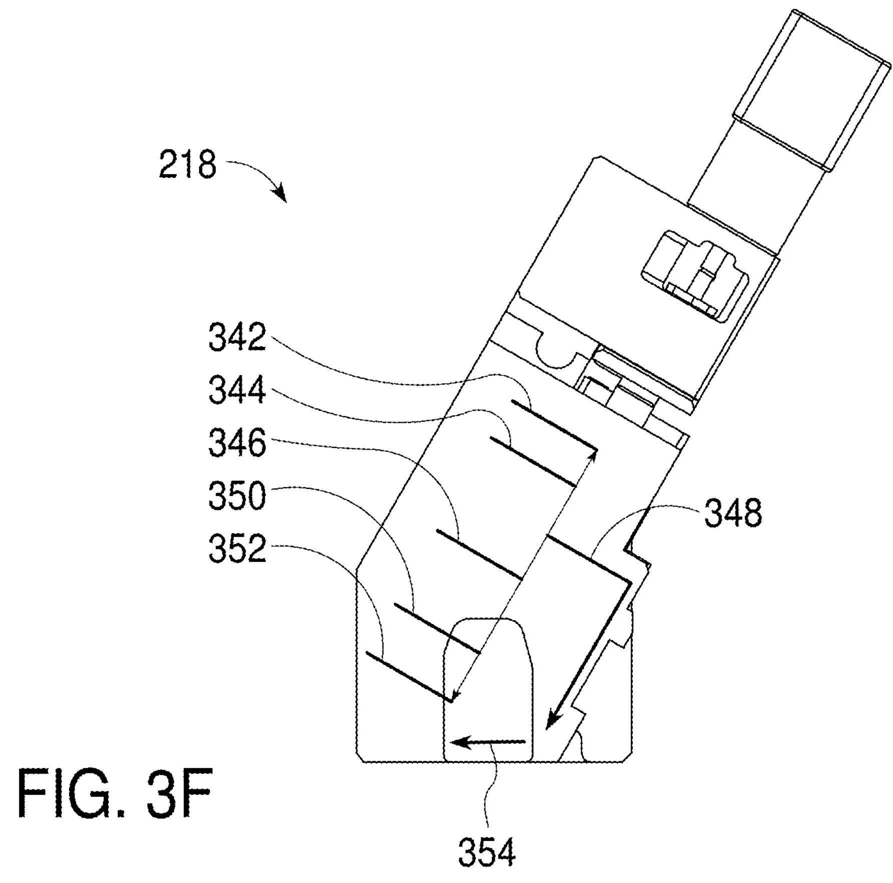
FIG. 3F shows a side view of a motorized rotation assembly of a digital lithography system in accordance with one or more embodiments of the disclosure.

The rotational motion of the rotation assembly 318 is shown in FIG. 3F to match the angle between the one or more exposure unit and the stage. A right hard stop 342 for rotation of the DMD may be at an angle of about 0.40° to about 0.50°, about 0.43° to about 0.48° or any individual value or sub-range within these ranges. A right switch limit 344 may be at an angle of about 0.70° to about 0.80°, about 0.72° to about 0.75° or any individual value or sub-range within these ranges. A nominal center position 346 may be located midway between the right hard stop 342 and the left hard stop 352 rotation limits. The nominal center position 346 may be at about 0.95° to about 1.5°, about 0.98° to about 1.1° or any individual value or sub-range within these ranges. Homing may be achieved with one or more opto-switch positioned at mid-range. The home position 348 may be positioned at about 0.8° to about 0.9°, or any individual value or sub-range within this range. A left switch limit 350 may be at an angle of about 1.20° to about 1.30°, about 1.22° to about 1.25° or any individual value or sub-range within these ranges. A left hard stop 352 may be at an angle of about 1.30° to about 1.40°, about 1.32° to about 1.36° or any individual value or sub-range within these ranges. A hard contact 354 may be positioned near the base of the rotation assembly 218 as shown in FIG. 3E.

Figure 3G:
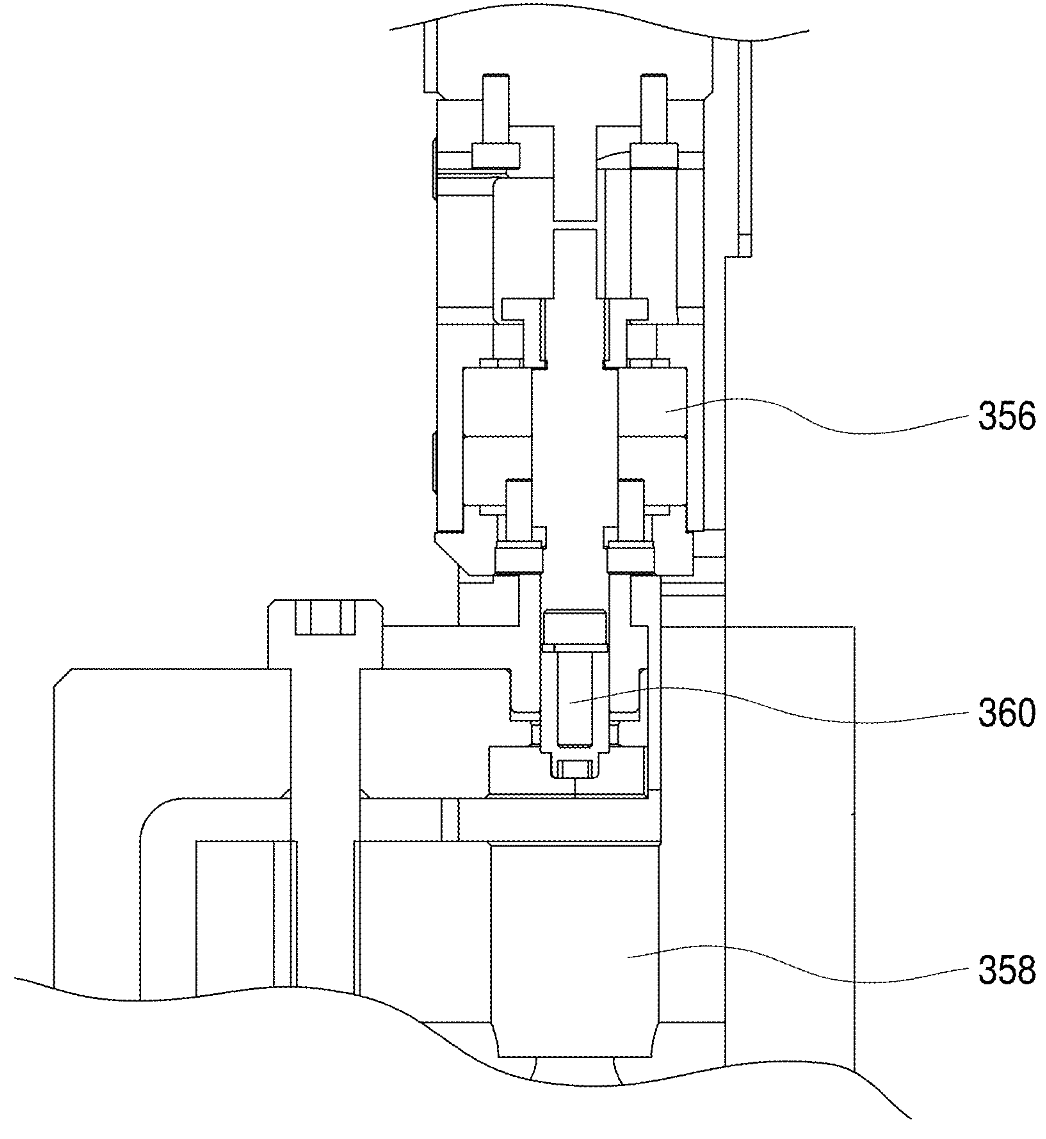
FIG. 3G shows a sectional view of a motorized rotation assembly of a digital lithography system in accordance with one or more embodiments of the disclosure.
Figure 4A:
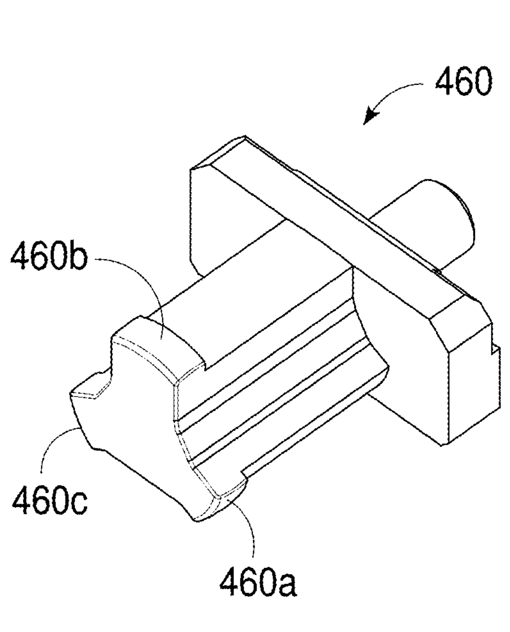
FIG. 4A shows an embodiment of a sphere mechanism of a kinematic socket of a digital lithography system in accordance with one or more embodiments of the disclosure.
Figure 4B:
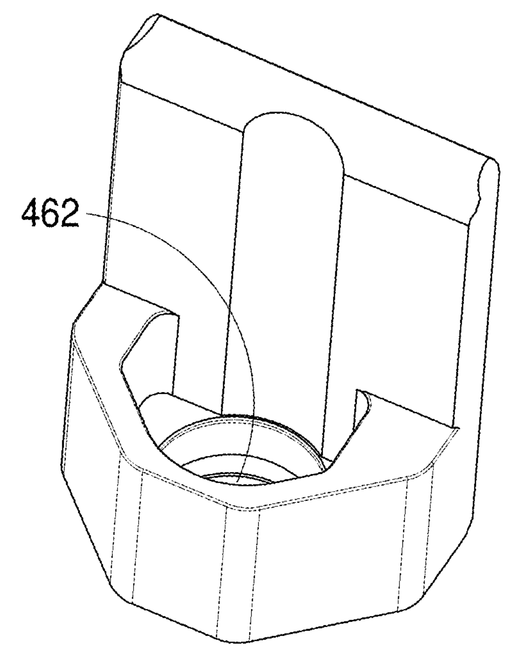
FIG. 4B shows an embodiment of a kinematic socket of a digital lithography system in accordance with one or more embodiments of the disclosure.
Figure 4C:
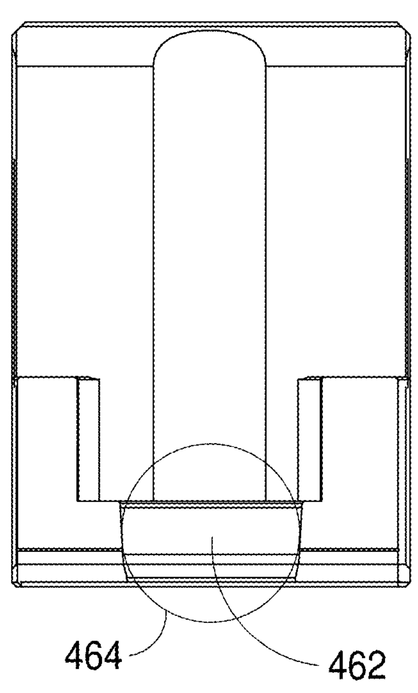
FIG. 4C shows an embodiment of a kinematic socket of a digital lithography system in accordance with one or more embodiments of the disclosure.
Figure 4D:
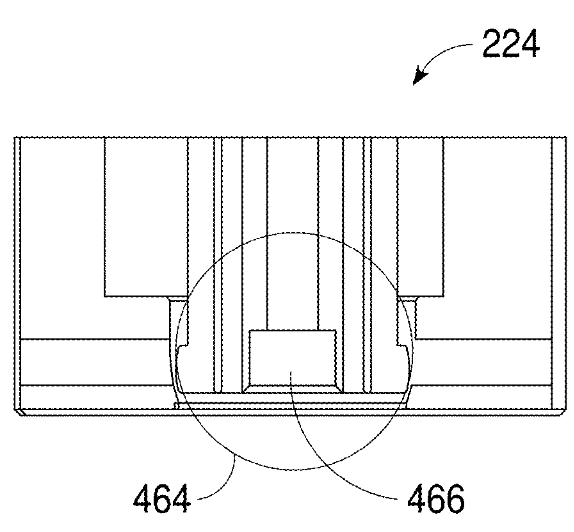
FIG. 4D shows an embodiment of a kinematic socket of a digital lithography system in accordance with one or more embodiments of the disclosure.

As shown in FIG. 3G, the rotation assembly 218 may further include one or more angular contact bearing having a medium preload. The preload may be provided by a compression spring 356, 358 applied about a lead screw 360.

According to one or more embodiments, the x-position accuracy of a photolithography system 200 having the motorized rotation assembly as described herein may be about ±0.01 mm to about ±0.5 mm, about ±0.1 mm to about ±0.25 mm or any individual value or sub-range within these ranges. The y-position accuracy similarly may be about ±0.01 mm to about ±0.5 mm, about ±0.1 mm to about ±0.25 mm or any individual value or sub-range within these ranges. The motorized rotation assembly in the photolithography system may provide a rotational range of about ±0.01° to about ±0.5°, about ±0.1° to about ±0.25° or any individual value or sub-range within these ranges. The motorized rotation assembly in the photolithography system may provide a resolution of less than about ±1 μrad, less than about ±2 μrad, less than about ±3 μrad or any individual value or sub-range within these ranges in order to support a ±3 μrad rotational angle accuracy. The photolithography system having the motorized rotation assembly therein may have an x-motion range (tip) of about ±1.0 mrad to about ±10 mrad, about ±2.0 mrad to about ±5.0 mrad, about ±3.0 mrad to about ±4.3 mrad or any individual value or sub-range within these ranges. The x-resolution (tip) of the combined system may be about 50 μrad to about 100 μrad, about 60 μrad to about 90 μrad, about 70 μrad to about 83 μrad or any individual value or sub-range within these ranges. The photolithography system having the motorized rotation assembly therein may have a y-motion range (tilt) of about ±1.0 mrad to about ±10 mrad, about ±2.0 mrad to about ±5.0 mrad, about ±3.0 mrad to about ±4.3 mrad or any individual value or sub-range within these ranges. The y-resolution (tilt) of the combined system may be about 1 μrad to about 50 μrad, about 10 μrad to about 40 μrad, about 25 μrad to about 30 μrad or any individual value or sub-range within these ranges. The photolithography system having the motorized rotation assembly therein may have a z-motion range of about ±0.10 mm to about ±1.0 mm, about ±0.20 mm to about ±0.90 mm, about ±0.30 mm to about ±0.75 mm or any individual value or sub-range within these ranges. The z-resolution of the combined system may be about 1 μm to about 10 μm, about 2 μm to about 9 μm, about 5 μm to about 8 μm or any individual value or sub-range within these ranges.

The digital photolithography system 200 having the motorized rotation assembly according to embodiments herein may have a static stability angle ($\theta_z$) of about ±0.1 μrad to about ±5.0 μrad, about ±0.5 μrad to about ±2.5 μrad, about ±0.1 μrad to about ±5.0 μrad, or any individual value or sub-range within these ranges. The dynamic stability (X) [i.e., lens to granite base displacement (@CV)] may be about ±1 nm to about ±10 nm, about ±2 nm to about ±9 nm, ±5 nm to ±8 nm, or any individual value or sub-range within these ranges. The dynamic stability (Y) [i.e., lens to granite base displacement (@CV)] may be about ±1 nm to about ±8 nm, about ±2 nm to about ±7 nm, ±3 nm to ±6 nm or any individual value, or sub-range within these ranges. The dynamic stability (Z) (i.e., lens to granite base displacement Z (@CV)] may be about ±1 nm to about ±50 nm, about ±5 nm to about ±40 nm, +10 nm to +25 nm, or any individual value or sub-range within these ranges. The first nat frequency (i.e., with respect to image plane displacement) may be at least about 100 Hz, at least about 150 Hz, at least about 200 Hz, at least about 250 Hz, or any individual value or sub-range within these ranges. In at least one embodiment of the digital photolithography system having the motorized rotation assembly as described herein, the X non-uniform drift since last calibration (i.e., with respect to the same stage X-Y coordinates, layer to layer comparison) may be about 10 nm to about 50 nm, about 15 nm to about 40 nm, about 15 nm to about 30 nm, or any individual value or sub-range within these ranges. Similarly, the Y non-uniform drift since last calibration (i.e., with respect to the same stage X-Y coordinates, layer to layer comparison) may be about 10 nm to about 50 nm, about 15 nm to about 40 nm, about 15 nm to about 30 nm, or any individual value or sub-range within these ranges. The tip/tilt/Z/DMD rotation stability during photolithography system maintenance should maintain the position of the eye within required accuracies after applying (and relaxing) a force of about 1N to about 50N, about 5N to about 25N, about 10N to about 20N, or any individual value or sub-range within these ranges, in XYZ (applied on top interface panel).

An embodiment of the kinematic socket 224 is shown in FIGS. 4A-4D. Kinematic socket 224 provides a second point of contact in the digital lithography system for stabilizing movement of the one or more exposure unit. The kinematic socket 224 may include a sphere mechanism 460 having three sections **460*a*, 460*b*, 460*c* such that the sphere 460 sits inside a socket seat 462 and the load of a corresponding exposure unit rests mostly on the kinematic socket 224. That is, the load of the exposure unit is supported by the socket seat 462 and when the X and Y stages translate in the X and Y directions, the center of sphere 460 provides a pivot point for tip and tilt functions. Sections 460*a*, 460*b*, 460*c* provide points of contacts and enable a kinematic joint that is not over constrained. In some embodiments, the components of the kinematic socket 224** are constructed of a metal, for example, stainless steel material, in particular, BK17 stainless steel.

An embodiment of a third contact mechanism 209 for stabilizing movement of the one or more exposure unit is shown in FIGS. 5A and 5B. As shown, contact mechanism 209 is comprised of line contact 210 attached to wall structure 271. Line contact 210 includes a cylindrical portion 280 that extends through a flange 282 of support structure 211 creating an eccentric cylinder arrangement. Cylindrical portion 280 has a smaller diameter than flange

282, which creates a gap 286 (e.g., an air gap) between the two components. Cylindrical portion 280 has transversely disposed therethrough a bore 284 configured having disposed therein a spring plunger 270. Although the embodiment depicted in FIGS. 5A and 5B show a spring plunger, it will be appreciated that other mechanisms for creating contact can be used, for example, a solid cylinder, a foam, a polymer, etc. The end portion of spring plunger 270 that contacts the inner surface of flange 282 at point of contact 278 may have a spherical shape. Contact between a base portion 284 and spring plunger 270 creates a point of contact 278 between the spring plunger 270 and an inner surface of flange 282. This arrangement stabilizes movement of cylindrical portion 280 within flange 282 and forces the mechanical contact of cylindrical portion 280 at desired points. Cylindrical portion 280 is configured to contact an inner surface of flange 282 at three points: 278, 279, 281. The arrangement of contact mechanism 209 allows the cylindrical portion 210 to rotate about its axis and also enables controlled tip, tilt and vertical movement providing four degrees of freedom TTZ and rotation of an exposure unit connected thereto. The third contact mechanism 209 together with contact mechanisms 309 and 224 can control movement of an exposure unit within nanometers.

Figure 6:
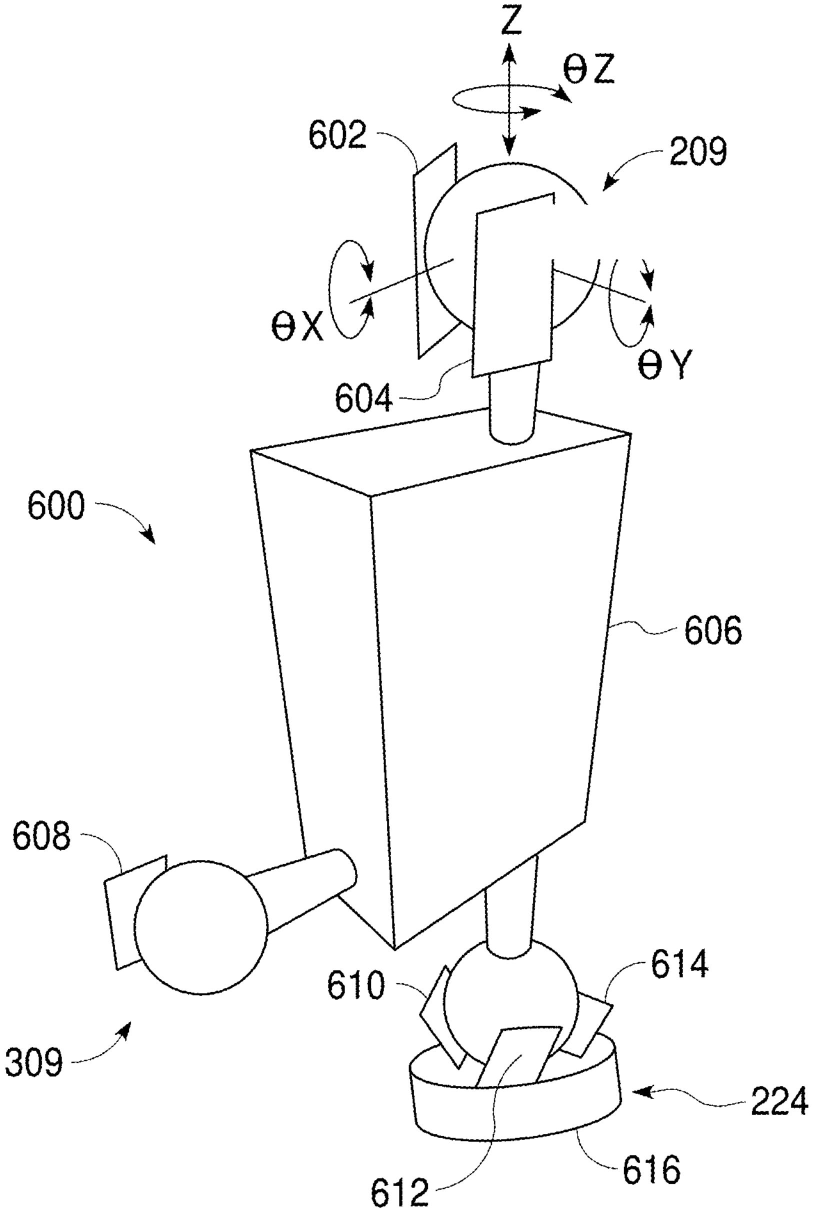
FIG. 6 is a representation of a digital lithography system in accordance with one or more embodiments of the disclosure showing the points of contact for stabilizing the EYE.

FIG. 6 shows a representation 600 of a digital lithography system in accordance with one or more embodiments of the disclosure showing the points of contact for stabilizing the exposure unit 606. Representation 600 shows the three (3) points of contact 209, 224, 309 of exposure unit 606 within the digital lithography system. As shown in FIG. 6, there can be six (6) points of contact at planes 602, 604, 608, 610, 612, 614 where five (5) of the planes can be fixed and do not move. When in contact with planes 602, 604, exposure unit 606 is not constrained to rotate in the θX, θY and θZ directions and is not constrained to slide in the Z direction. Plane 608 constrains rotation of exposure unit 606 in θZ direction. If plane 608 moves in the Y direction, rotation will occur around the Z axis and tunes the angle of the exposure unit 606. If planes 610, 612, 614 move in the Z direction (to adjust the height of the exposure unit 606), the structure is free to slide in the Z direction. Planes 610, 612, 614 constrain rotation in θX and θY, but permit rotation in θZ. Digital lithography systems as described herein having points of contact 209, 224, 309 provide four degrees of freedom (tip, tilt, vertical, rotation) for movement of the exposure unit therein.

An embodiment of a method 700 of positioning one or more exposure unit in a photolithography system is shown in FIG. 7. Method 500 includes at block 702 moving a stage in relation to one or more exposure unit in at least one of an x-direction, a y-direction or a z-direction. In at least one embodiment, the stage may be positioned beneath the one or more exposure unit. Movement of the stage in the x-direction or the y-direction is lateral with respect to the one or more exposure unit. Movement of the stage in the z-direction is vertical in relation to the one or more exposure unit.

At block 704 method 700 includes rotating the one or more exposure unit by a rotation assembly (as described herein) of the photolithography system to align the one or more exposure unit with the stage. The rotation assembly is configured to rotate the one or more exposure unit relative to the stage about a z-axis. The z-axis is defined by the two hinges. Rotation of the one or more exposure unit aligns the EYEs with each other and with the stage (and any substrates thereon) below. In at least one embodiment, rotation of the one or more exposure unit includes adjusting an angle of the one or more exposure units about the z-axis. In at least one embodiment, the system includes a plurality of exposure units and the rotation assembly rotates all of the units to adjust their angle with respect to the z-axis and align them with each other and with the stage. The system may then use a single set of parameters for all of the exposure units. The parameters include, but are not limited to, exposure multiplicity and GDP. An angle variation of the one or more exposure unit is less than about 5 μrad, or less than about 3 μrad.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

As used herein, the singular forms "a," "an," and "the" include plural references unless the context clearly indicates otherwise. Thus, for example, reference to "a precursor" includes a single precursor as well as a mixture of two or more precursors; and reference to a "reactant" includes a single reactant as well as a mixture of two or more reactants, and the like.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%, such that "about 10" would include from 9 to 11.

The term "at least about" in connection with a measured quantity refers to the normal variations in the measured quantity, as expected by one of ordinary skill in the art in making the measurement and exercising a level of care commensurate with the objective of measurement and precisions of the measuring equipment and any quantities higher than that. In certain embodiments, the term "at least about" includes the recited number minus 10% and any quantity that is higher such that "at least about 10" would include 9 and anything greater than 9. This term can also be expressed as "about 10 or more." Similarly, the term "less than about" typically includes the recited number plus 10% and any quantity that is lower such that "less than about 10" would include 11 and anything less than 11. This term can also be expressed as "about 10 or less."

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to illuminate certain materials and methods and does not pose a limitation on scope. No language in the specification should be construed as indicating any non-claimed element as essential to the practice of the disclosed materials and methods.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A rotation assembly configured to rotate at least one exposure unit, the rotation assembly comprising:
 a kinematic socket configured to support the at least one exposure unit, the kinematic socket comprising a socket seat and a sphere mechanism configured to rotate in the socket seat, wherein the socket seat is configured to support a load of the exposure unit during translational movement of the at least one exposure unit and the sphere mechanism is a pivot point for tip and tilt movement of the at least one exposure unit.

2. The rotation assembly of claim 1, wherein the at least one exposure unit comprises a digital micro-mirror device (DMD).

3. The rotation assembly of claim 1, wherein the sphere mechanism comprises a plurality of sections configured to rotate within the socket seat.

4. The rotation assembly of claim 1, wherein rotation of the exposure unit comprises an angle variation of less than about 5 μrad, or less than about 3 μrad.

5. The rotation assembly of claim 1, further comprising a rotation pad configured to receive a force from the rotation assembly.

6. The rotation assembly of claim 5, further comprising a bias spring configured to apply the force to the rotation pad and rotate the at least one exposure unit about a pivot point.

7. The rotation assembly of claim 1, further comprising a bridge structure configured to maintain stability of the at least one exposure unit.

8. A photolithography system, comprising:
 at least one exposure unit configured to rotate by a rotation assembly; and
 a platform spaced apart from the at least one exposure unit, wherein the platform is configured to move in an x-direction, a y-direction and a z-direction with respect to the at least one or more exposure unit;
 the rotation assembly comprising:
 a first contact mechanism configured to stabilize movement of the at least one exposure unit, the first contact mechanism comprising a kinematic socket configured to support the at least one exposure unit, the kinematic socket comprising a socket seat and a sphere mechanism configured to rotate in the socket seat, wherein the socket seat is configured to support a load of the at least one exposure unit during translational movement of the at least one exposure unit and the sphere mechanism is a pivot point for tip and tilt movement of the at least one exposure unit;
 wherein the rotation assembly is mounted to the photolithography system by at least three contact points.

9. The photolithography system of claim 8, wherein rotation of the exposure unit comprises an angle variation of the at least one exposure unit of less than about 5 μrad.

10. The photolithography system of claim 8, further comprising:
 a second contact mechanism configured to stabilize movement of the at least one exposure unit, the second contact mechanism comprising a spring and pad assembly; and
 a third contact mechanism configured to stabilize movement of the at least one exposure unit, the third contact mechanism comprising a line contact comprising a cylindrical portion that extends through a flange of a support structure creating an eccentric cylinder arrangement.

11. The photolithography system of claim 10, wherein the at least one exposure unit comprises a digital micro-mirror device (DMD).

12. The photolithography system of claim 10, further comprising a bridge structure configured to maintain stability of the at least one exposure unit.

13. A method of positioning at least one exposure unit in a photolithography system, the method comprising:
 moving a stage in relation to the at least one exposure unit in at least one of an x-direction, a y-direction or a z-direction; and
 rotating the at least one exposure unit by a rotation assembly of the photolithography system to align the at least one exposure unit with the stage, wherein rotation assembly comprises a kinematic socket configured to support the at least one exposure unit, wherein the kinematic socket comprises a socket seat and a sphere mechanism received in the socket seat, wherein the socket seat is configured to support a load of the exposure unit during translational movement of the at least one exposure unit, and wherein the sphere mechanism is a pivot point for tip and tilt movement of the at least one exposure unit.

14. The method of claim 13, wherein moving the stage comprises aligning the stage with the at least one exposure unit.

15. The method of claim 13, wherein rotating comprises adjusting an angle of the at least one exposure unit about a z-axis.

16. The method of claim 15, wherein an angle variation of the at least one exposure unit is less than about 5 μrad, or less than about 3 μrad.

17. The method of claim 13, wherein the photolithography system comprises a plurality of exposure units.

18. The method of claim 17, wherein rotating comprises aligning a first exposure unit of the plurality of exposure units to a second exposure unit of the plurality of exposure units and to the stage.

19. The method of claim 18, further comprising using a single set of parameters for the plurality of exposure units.

* * * * *